United States Patent
Zhou et al.

(10) Patent No.: US 9,761,254 B2
(45) Date of Patent: Sep. 12, 2017

(54) SIDE SHIELDED MAGNETORESISTIVE (MR) READ HEAD WITH PERPENDICULAR MAGNETIC FREE LAYER

(71) Applicant: Headway Technologies, Inc., Milpitas, CA (US)

(72) Inventors: Yuchen Zhou, San Jose, CA (US); Kunliang Zhang, Fremont, CA (US); Zhi Gang Bai, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 15/363,168

(22) Filed: Nov. 29, 2016

(65) Prior Publication Data

US 2017/0077391 A1    Mar. 16, 2017

Related U.S. Application Data

(62) Division of application No. 14/581,141, filed on Dec. 23, 2014, now Pat. No. 9,520,147, which is a division
(Continued)

(51) Int. Cl.
*G11B 5/39*        (2006.01)
*G11B 5/11*        (2006.01)
(Continued)

(52) U.S. Cl.
CPC .............. *G11B 5/398* (2013.01); *B82Y 10/00* (2013.01); *B82Y 25/00* (2013.01); *B82Y 40/00* (2013.01);
(Continued)

(58) Field of Classification Search
None
See application file for complete search history.

(56) References Cited

U.S. PATENT DOCUMENTS

| | | |
|---|---|---|
| 6,943,993 B2 | 9/2005 | Chang et al. |
| 7,355,822 B2 | 4/2008 | Daughton et al. |

(Continued)

FOREIGN PATENT DOCUMENTS

| | | |
|---|---|---|
| JP | 2006-190360 | 7/2006 |
| JP | 2009283499 | 12/2009 |

OTHER PUBLICATIONS

"Magneto-Resistive Read Sensor With Perpendicular Magnetic Anisotropy," by Yunfei Ding, et al., IEEE Transactions on Magnetics, vol. 41, No. 2, Feb. 2005, pp. 707-712.
(Continued)

*Primary Examiner* — Craig A. Renner
(74) *Attorney, Agent, or Firm* — Saile Ackerman LLC; Stephen B. Ackerman

(57) ABSTRACT

A MR sensor is disclosed that has a free layer (FL) with perpendicular magnetic anisotropy (PMA), which eliminates the need for an adjacent hard bias structure to stabilize free layer magnetization, and minimizes shield-FL interactions. In a TMR embodiment, a seed layer, free layer, junction layer, reference layer, and pinning layer are sequentially formed on a bottom shield. After forming a sensor sidewall that stops in the seed layer or on the bottom shield, a conformal insulation layer is deposited. Thereafter, a top shield is formed on the insulation layer and includes side shields that are separated from the FL by a narrow read gap. The sensor is scalable to widths <50 nm when PMA is greater than the FL self-demag field. Effective bias field is rather insensitive to sensor aspect ratio, which makes tall stripe and narrow width sensors viable for high RA TMR configurations.

10 Claims, 6 Drawing Sheets

Related U.S. Application Data of application No. 12/799,924, filed on May 5, 2010, now Pat. No. 8,953,285.

(51) Int. Cl.

| | | |
|---|---|---|
| *B82Y 10/00* | (2011.01) | |
| *B82Y 25/00* | (2011.01) | |
| *G01R 33/09* | (2006.01) | |
| *H01F 10/30* | (2006.01) | |
| *H01F 10/32* | (2006.01) | |
| *H01F 41/30* | (2006.01) | |
| *B82Y 40/00* | (2011.01) | |
| *H01L 43/02* | (2006.01) | |
| *H01L 43/08* | (2006.01) | |

(52) U.S. Cl.
CPC ......... *G01R 33/093* (2013.01); *G01R 33/098* (2013.01); *G11B 5/3909* (2013.01); *G11B 5/3912* (2013.01); *H01F 10/30* (2013.01); *H01F 10/3259* (2013.01); *H01F 10/3286* (2013.01); *H01F 10/3295* (2013.01); *H01F 41/307* (2013.01); *H01L 43/02* (2013.01); *H01L 43/08* (2013.01); *G11B 5/3906* (2013.01); *G11B 2005/3996* (2013.01)

(56) References Cited

U.S. PATENT DOCUMENTS

| | | | |
|---|---|---|---|
| 7,443,638 B2 | 10/2008 | Wang et al. | |
| 7,479,394 B2 | 1/2009 | Homg et al. | |
| 7,532,442 B2 | 5/2009 | Gill | |
| 8,184,411 B2 | 5/2012 | Zhang et al. | |
| 8,953,285 B2* | 2/2015 | Zhou et al. ......... | G11B 5/3909 360/324.12 |
| 2005/0157243 A1 | 7/2005 | Hayata et al. | |
| 2006/0139028 A1 | 6/2006 | Daughton et al. | |
| 2006/0291108 A1 | 12/2006 | Sbiaa et al. | |
| 2007/0111332 A1 | 5/2007 | Zhao et al. | |
| 2007/0148786 A1 | 6/2007 | Homg et al. | |
| 2008/0117552 A1 | 5/2008 | Zhou et al. | |
| 2009/0185315 A1 | 7/2009 | Xue et al. | |

OTHER PUBLICATIONS

"Thermally Excited Low Frequency Magnetic Noise in CPP Structure MR Heads," by Yuchen Zhou, IEEE Transactions on Magnetics, vol. 43, No. 6, Jun. 2007, pp. 2187-2192.

\* cited by examiner

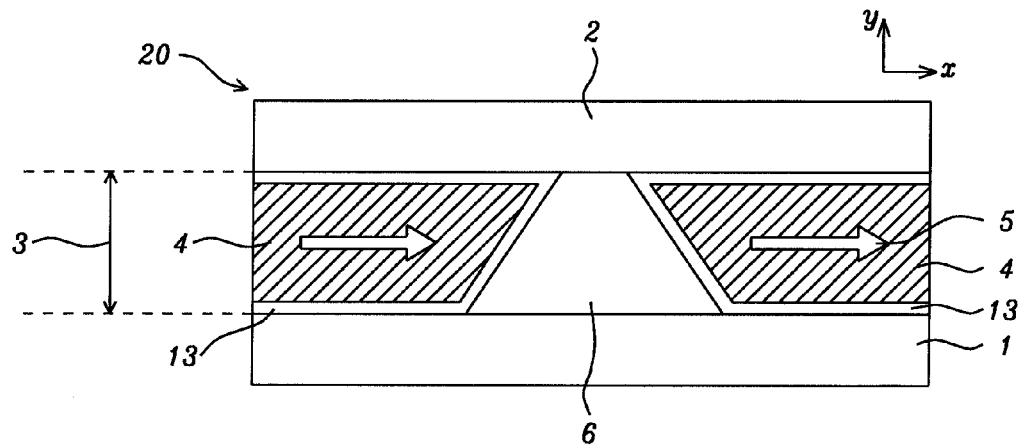
FIG. 1a — Prior Art
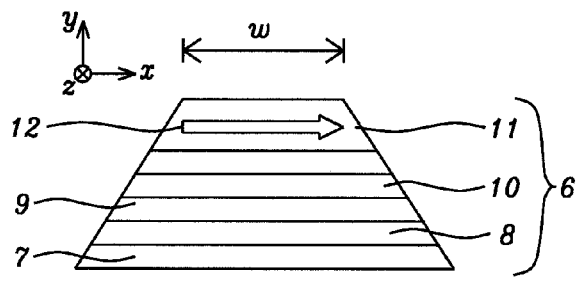
FIG. 1b — Prior Art
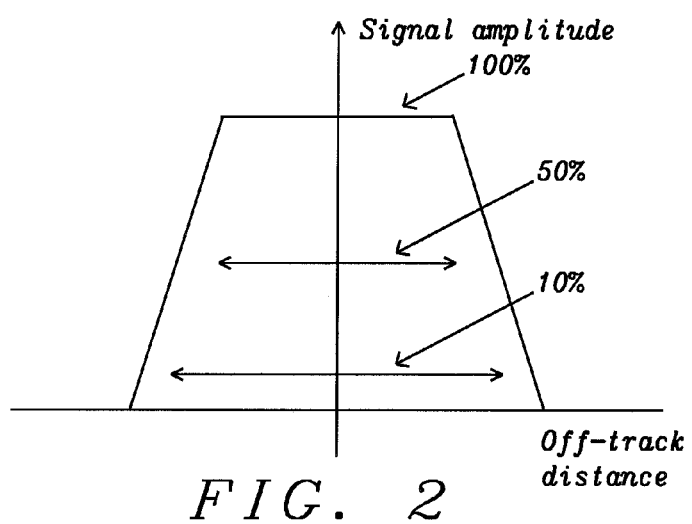
FIG. 2

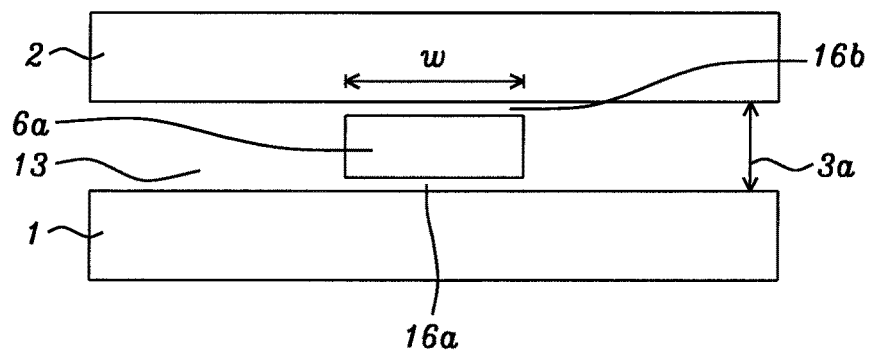
FIG. 3c
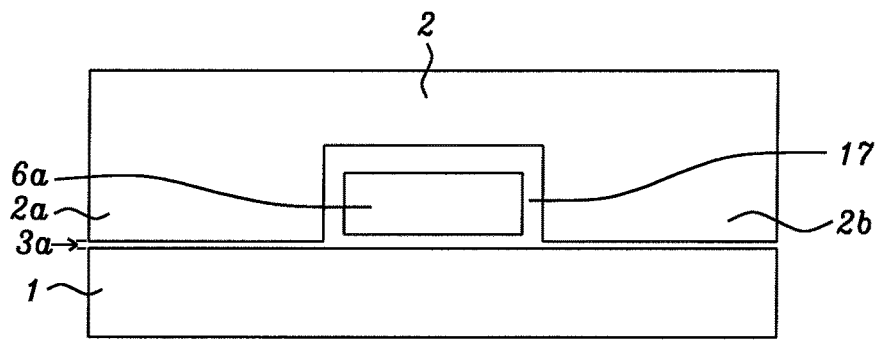
FIG. 3d
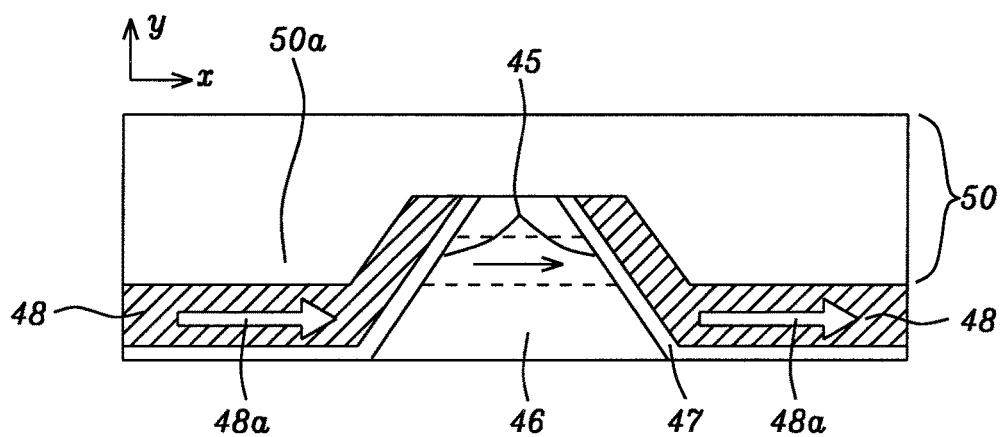
FIG. 4 – Prior Art

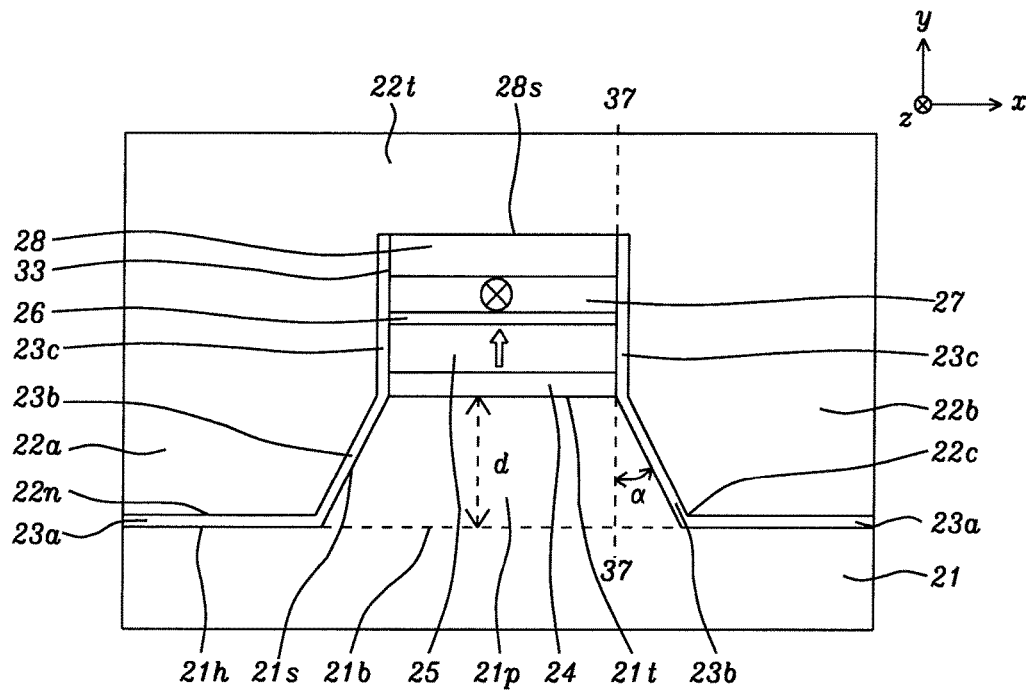
FIG. 6
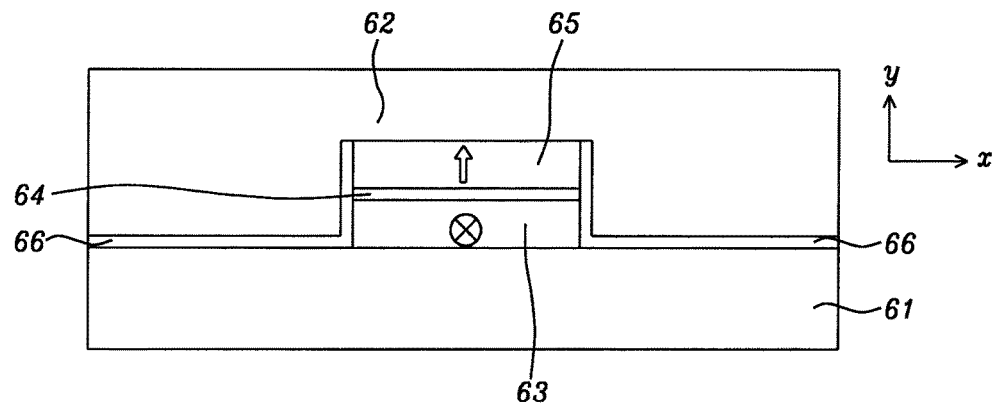
FIG. 7 - Prior Art

SIDE SHIELDED MAGNETORESISTIVE (MR) READ HEAD WITH PERPENDICULAR MAGNETIC FREE LAYER

This is a divisional application of U.S. patent application Ser. No. 14/581,141; filed on Dec. 23, 2014, which is a divisional application of U.S. patent application Ser. No. 12/799,924, filed on May 5, 2010 (issued as U.S. Pat. No. 8,953,285 on Feb. 10, 2015), which are herein incorporated by reference in their entirety, and assigned to a common assignee.

RELATED PATENT APPLICATION

This application is related to U.S. Pat. No. 8,184,411; assigned to the same assignee and herein incorporated by reference in its entirety.

FIELD OF THE INVENTION

The invention relates to a read head in which a sensor has a top spin valve configuration with a bottom free layer that is self biasing through intrinsic perpendicular magnetic anisotropy (PMA) so that a hard bias layer is not needed for stabilization thereby enabling a narrow track width and minimal interaction with side shields for high density applications.

BACKGROUND OF THE INVENTION

As the data areal density in hard disk drives (HDD) continuously increases because of technology improvements, the MR sensor that is used as the read-back element in HDD is required to have increasingly better special resolution while maintaining a reasonable signal-to-noise ratio (SNR). The sensor is a critical component in which different magnetic states are detected by passing a sense current through the sensor and monitoring a resistance change. A common giant magnetoresistive (GMR) configuration includes two ferromagnetic layers which are separated by a non-magnetic conductive layer in the sensor stack. One of the ferromagnetic layers is a pinned layer wherein the magnetization direction is fixed by exchange coupling with an adjacent anti-ferromagnetic (AFM) pinning layer. The second ferromagnetic layer is a free layer wherein the magnetization vector can rotate in response to external magnetic fields. In the absence of an external magnetic field, the magnetization direction of the free layer is aligned perpendicular to that of the pinned layer by the influence of hard bias layers on opposite sides of the sensor stack. When an external magnetic field is applied by passing the sensor over a recording medium along an air bearing surface (ABS), the free layer magnetic moment may rotate to a direction which is parallel to that of the pinned layer which is a lower resistance state than in the perpendicular alignment. Alternatively, in a tunneling magnetoresistive (TMR) sensor, the two ferromagnetic layers are separated by a thin non-magnetic dielectric layer.

Referring to FIG. 1a, a generic TMR head 20 is shown and represents the major MR sensor structure that is used in state of the art HDD. A typical TMR head has a top shield 2 and bottom shield 1 with a sensor stack 6 including a free layer (not shown) that is formed between the top and bottom shields and between adjacent hard bias magnets 4. Hard bias structures 4 with a longitudinal magnetization 5 provide a biasing magnetic field on the sides of the sensor stack 6 to orientate the free layer magnetization 12 (FIG. 1b) in the x-axis direction. The thickness of the sensor stack is also referred to as the reader shield spacing (RSS) 3. There is an insulation layer 13 that separates the sensor stack 6 from hard bias structure 4.

In FIG. 1b, a sensor stack 6 having a bottom spin valve configuration is depicted wherein a pinned layer 7, coupling layer 8, reference layer 9, tunnel barrier layer 10, and free layer 11 having a magnetization direction 12 are sequentially formed on the bottom shield (not shown). In addition, there is usually an anti-ferromagnetic (AFM) layer (not shown) between the bottom shield and pinned layer 7, and a top electrode or capping layer (not shown) that separates free layer 11 from top shield 2. Current efforts to further increase area data density involve developing a greater data linear density along a down-track (y-axis) direction and a higher track density along the cross-track (x-axis) direction. Along with a higher track density, a read head with higher spatial resolution in the cross-track direction is required.

Referring to FIG. 2, a schematic drawing of a read-back cross track profile is illustrated which is obtained by scanning the read head across a given data track and plotting the read-back amplitude vs. the off-track distance (distance from track center). The 100% amplitude is the read-back signal when the head is positioned perfectly at track center while uMRW-10% and uMRW-50% are the 10% and 50% micro magnetic read widths that are defined by the width of the cross track profile in FIG. 2 at amplitudes corresponding to 10% and 50% of the track center amplitude. A higher cross track resolution read head means lower uMRW-50% and uMRW-10% values. To achieve higher read-back resolution in the cross track direction, the read head will need to have less side reading of data tracks on the sides of the current track to reduce interference when track density is higher.

Generally, reducing read width is accomplished by reducing the cross track width of sensor stack 6 (width along x-axis in FIG. 1b). In addition, it is known that a smaller RSS 3 and implementing a side shield in the read gap (not shown) can further reduce the effective read width to enhance cross-track resolution. Sensor stack width is effectively the width of free layer 11, which is the distance w.

Referring to FIGS. 3a-3b, simulation results of a read head with different physical sensor stack widths w (FIG. 3c) are shown. The x-axis is effectively uMRW-50% and the y-axis is the ratio (uMRW-10%/uMRW-50%) that represents resolution sharpness. Curve 41 in FIG. 3a is a plot of signal sharpness vs. uMRW-50% for a sensor stack width of 25 nm (data point 41a), 35 nm (data point 41b), and 45 nm (data point 41c) and a RSS 3a of 30 nm (FIG. 3c). Note that sensor stack 6a is essentially equivalent to sensor stack 6 in FIG. 1 except the cross-sectional profile in FIG. 3c is shown as a rectangle rather than a trapezoid and gap layers 16a, 16b are included between sensor stack 6a and top and bottom shields 1, 2, respectively. In this case, RSS 3a is equal to the thickness of sensor stack 6a plus the thickness of gap layers 16a, 16b. Also, the hard bias (HB) structure 4 in FIG. 1 is not shown in FIG. 3c. Curve 42 (FIG. 3a) is similar to curve 41 except RSS 3a is reduced to 20 nm. Therefore, data points 42a, 42b, 42c represent a sensor stack width of 25, 35, and 45 nm, respectively, and a RSS of 20 nm. Curve 41 in FIG. 3a indicates a clear trend of narrower sensor stack width producing a narrower read width (uMRW-50%). More importantly, a smaller RSS as shown in Curve 42 compared with Curve 41 also yields a narrower read width. In FIG. 3b, an additional curve 43 is plotted and represents a condition where side shields 2a, 2b are added in the read gap near the sides of the sensor stack 6a (FIG. 3d) to generate an edge gap 17 with a distance between side shield 2a (or 2b) and free layer in sensor stack 6a of 2 nm. Data points 43a, 43b, 43c represent a sensor stack width of 25, 35, and 45 nm, respectively. Spacing 3a between side shield 2a (or 2b) and bottom shield 1 is reduced to 2 nm. When side shields are present, further reduction in read width is demonstrated. By taking advantage of a smaller RSS (FIG. 3a) or including side shields (FIG. 3b), the ratio (uMRW-10%/uMRW-50%) decreases together with smaller uMRW-50% values thereby indicating reduction in uMRW-10% values as well. It follows that by implementing narrower RSS and side shields, read head cross-track resolution can be improved significantly.

It should be understood by those skilled in the art that reducing RSS 3 and inserting side shields adjacent to sensor stack 6 in FIG. 1a is very difficult to achieve. In particular, a smaller RSS 3 means the thickness of HB structure 4 must decrease accordingly. Unfortunately, a thinner HB structure 4 will lead to a weaker pinning field on edges of free layer 11 and will yield a less stable sensor. Meanwhile, magnetostatic coupling between HB structure 4 and top shield 2 will become greater as the spacing between the aforementioned elements decreases which can easily result in a rotation of HB magnetization 5 away from a longitudinal direction in the proximity of free layer 11. Thus, stronger coupling between top shield 2 and HB structure 4 will degrade the effective HB field on the free layer edge magnetization.

With regard to a side shield formed adjacent to a conventional MR sensor, U.S. Pat. No. 6,943,993 describes a structure similar to FIG. 4. Referring to FIG. 4, a portion 50a of top read shield 50 is extended into the read gap (not shown) on either side of a MR sensor stack 46 in an attempt to shield the sensor from being affected by adjacent data tracks (not shown). Spacers 47 separate the MR sensor stack 46 from the HB structure 48. The most obvious drawback of this design is that top shield portion 50a is brought quite close to the HB structure 48 such that HB to top shield coupling will reduce the HB stabilizing field 48a on free layer edges 45 significantly and cause the free layer to be extremely unstable and thereby produce a noisy sensor.

To minimize the HB to top shield coupling issue, perpendicular easy axis growth in a HB structure as disclosed in U.S. Patent Application 2008/0117552 may be employed for a sensor requiring a hard bias structure for stabilization. However, it is even more desirable if a sensor can be designed without a HB structure to avoid the HB-shield coupling entirely.

In addition to the presence of a hard bias structure being a limiting factor in further reducing read gap spacing and sensor track width, the free layer is another contributor to instability at narrow sensor width, especially when a side shield is employed. When the free layer (FL) has an in-plane magnetization and as track width is reduced to accommodate higher track density, the edge surface demagnetization field (demag field) from the magnetic charges created by FL magnetization contacting the confined cross-track edges of the FL becomes stronger. For sensor widths below 30 nm and a read gap dimension less than 20 nm on the side of a sensor stack, it is likely that a HB structure 4 as in FIG. 1 is not able to produce enough stabilizing field to compensate for a build up in FL edge demag field. As a result, the FL edge is not well pinned and undesirable magnetization fluctuations from thermal excitation will occur as described by Y. Zhou in "Thermally Excited Low Frequency Magnetic Noise in CPP structure MR heads", IEEE Trans. Magn., vol. 43, pp. 2187 (2007). Additionally, when side shields are included in the read head and there is a side shield to FL edge gap of 2 nm or less, strong coupling will arise between charges on the FL edge and on the side shield edge that face each other. This coupling will lead to more free layer instability.

In order to overcome the shortcomings of the prior art and to achieve a high performance MR sensor for both narrow read gap and narrow track width, the following requirements are needed when considering devices with a data area density of greater than 1 Tb/inch$^2$: (1) magnetic biasing is achieved on free layer magnetization without any permanent magnet hard bias structure; (2) magnetic biasing strength is not affected by or can be easily compensated for at narrow read gap distances; (3) free layer self demag field does not produce a higher destabilizing effect on the free layer at smaller design sizes; and (4) magnetostatic coupling from side shield edges on the FL edge is minimized.

In other prior art references, Y. Ding et al. in "Magneto-Resistive Read Sensor with Perpendicular Magnetic Anisotropy", IEEE Trans. Magn., vol. 41, pp 707 (2005), a magnetic sensor with a free layer having PMA is discussed but is focused primarily on the FL material properties and does not propose any viable sensor structure.

Referring to FIG. 7, U.S. Patent Application Publication 2009/0185315 shows a FL with PMA and a side/top shield 62 that is separated from bottom shield 61 by an insulator layer 66. The sensor stack has a reference layer 63, junction layer 64, and free layer 65 formed sequentially on the bottom shield. However, an intrinsic flaw of this design is that FL 65 is deposited on the junction layer, which is not feasible with TMR sensors having an oxide junction layer since there must be a magnetic layer abutting the junction layer to realize a high MR signal. When a FL with PMA is formed directly on an oxide layer such as junction layer 64, it is difficult to achieve good PMA. A buffer/seed layer is typically required to establish PMA in an overlying FL but the buffer/seed layer is non-magnetic and cannot produce a high MR ratio as mentioned previously. Therefore, an improved MR read head design is needed that incorporates a FL with high PMA and a TMR sensor configuration without an adjacent hard bias layer for stabilization.

U.S. Pat. No. 7,532,442 teaches a pinning layer made of CoPt in a bottom spin valve or dual spin valve configuration but the CoFe/NiFe free layer does not have any PMA character.

In U.S. Patent Application Publication 2006/0139028, 2-D superparamagnetic bodies are used in a free layer to minimize the free layer thickness needed for a high MR ratio and to avoid a longitudinal biasing structure.

SUMMARY OF THE INVENTION

One objective of the present invention is to provide a MR read head that simultaneously incorporates both of a narrow read gap and a side shield.

A second objective of the present invention is to provide a free layer having perpendicular magnetic anisotropy (PMA) to achieve FL magnetic biasing with an intrinsic anisotropy field thereby eliminating the need for a permanent magnet hard bias and the side shield-HB coupling effects on FL layer stability.

A third objective of the present invention is to provide a stable free layer at small sensor widths by using a free layer according to the second objective where PMA eliminates FL edge demag field induced FL destabilization.

Another objective of the present invention is to achieve minimal coupling between side shield edges and free layer edges by employing a free layer with PMA.

Another objective of the present invention is to provide a MR sensor structure in accordance with the previous objectives that has high performance, a TMR junction, and is capable of being fabricated with existing materials and processes.

According to one embodiment, these objectives are achieved in a MR read head that includes a sensor stack with a free layer having PMA and formed between a bottom shield and a top shield. Free layer PMA is higher than the demag field within the FL and thereby orientates FL magnetization perpendicular to the plane of the free layer at zero field. The sensor stack has a width less than about 100 nm and is formed by sequentially depositing a seed layer, free layer, junction layer, reference layer, and exchange pinning layer on the bottom shield. There is a sidewall along the edges of the sensor stack layers and an insulation layer is formed on the sensor stack sidewall and on the bottom shield to separate the top shield from the sensor stack and to separate top and bottom shields, respectively. In one aspect, the insulation layer is essentially conformal to the sidewall. PMA is achieved not only by selecting an appropriate seed layer but also by employing an anneal step at a temperature greater than room temperature. Furthermore, a field may be applied during the anneal process. The junction layer may be an oxide of a metal or alloy to give a TMR configuration. Alternatively, the junction layer may be a metal such as Cu to yield a GMR configuration. In another embodiment, the GMR sensor stack is modified to incorporate metal nanopillars in an insulator matrix between two copper layers, for example, in a confining current pathway or CCP scheme. Current flows between top and bottom shields in a current perpendicular to plane (CPP) direction. The reference layer is any high moment soft magnetic layer.

The exchange pinning layer at the top of the sensor stack may have one of three configurations. In one embodiment, the exchange pinning layer is part of a synthetic anti-ferromagnetic (SyAF) arrangement wherein a coupling layer such as Ru contacts the top surface of the reference layer and a pinned layer contacts a top surface of the coupling layer. Furthermore, there is an anti-ferromagnetic (AFM) layer contacting the pinned layer to pin the SyAF structure through exchange coupling. Optionally, the exchange pinning layer may be a single AFM layer contacting a top surface of the reference layer. In a third embodiment, the exchange pinning layer is a hard magnetic material with a high in-plane anisotropy which is first magnetized into the sensing direction of the sensor by a strong field, and then exchange couples with the reference layer.

Sections of the top shield that adjoin the insulation layer along the sidewall of the sensor stack may be considered side shields and preferably extend below the bottom surface of the free layer but do not extend below a plane including the bottom surface of the seed layer according to a first embodiment. The read head may be fabricated by first depositing the sensor stack film on the bottom shield. Next, a photoresist is coated and patterned on the sensor stack followed by an etch process that forms a sensor sidewall and stops in the seed layer or slightly into the bottom shield. Then the insulation layer is deposited on the sensor sidewall and over exposed regions of the seed layer or bottom shield. After the photoresist mask is stripped, the top shield is formed by deposition or plating and is preferably conformal to the topography of the sensor stack and the bottom shield. A top surface of the sensor stack is in electrical contact with the top shield.

In a second embodiment, the sensor stack is formed with the same configuration on the bottom shield as in the first embodiment. However, after the photoresist patterning step, the etch process extends a substantial distance into the bottom shield to generate a pedestal portion of the bottom shield below the sensor stack. Moreover, the pedestal portion of the bottom shield preferably has a greater width than the sensor stack width. Thus, the sensor stack may have a sidewall that is essentially perpendicular to the bottom shield while the sidewall formed along the pedestal portion has a less vertical slope. Preferably, a conformal insulation layer is deposited along the sidewalls of the sensor stack and bottom shield and on horizontal portions of the bottom shield. Thereafter, the photoresist is stripped and the top shield is deposited on the insulation layer including along the sidewall of the bottom shield. Thus, the top shield extends below a plane that includes the interface between the seed layer and bottom shield to provide a greater shielding effect on the free layer.

BRIEF DESCRIPTION OF THE DRAWINGS

FIG. 1a is a cross-sectional view showing a conventional read head where a hard bias layer provides longitudinal bias to stabilize a free layer with a magnetization parallel to the planes of the sensor stack layers.

FIG. 1b is an enlarged view of the sensor stack in FIG. 1a where a reference layer, tunnel barrier layer, and free layer are sequentially formed on a substrate in a bottom spin valve configuration.

FIG. 2 is a plot of a read-back cross track profile where signal amplitude is plotted against off-track distance to determine a measure of sharpness in signal amplitude.

FIG. 3c is a cross-sectional view of a MR read head similar to FIG. 1 except that gaps are included between the sensor stack and top and bottom shields, and the hard bias structure is omitted.

FIG. 3d is a modification of the read head in FIG. 3c where side shields are formed adjacent to the sensor stack sidewalls.

FIG. 4 is a prior art MR read head structure with a hard bias structure and a partial side shield adjacent to the sensor stack.

FIG. 6 is a cross-sectional view of a MR sensor stack with a top spin valve configuration and having a self-biasing free layer with PMA, and an extended shield structure according to another embodiment of the present invention.

FIG. 7 depicts a prior art MR read head in which a sensor stack has a bottom spin valve configuration and a free layer with PMA is formed on a tunnel barrier layer.

DETAILED DESCRIPTION OF THE INVENTION

Figure 3A:
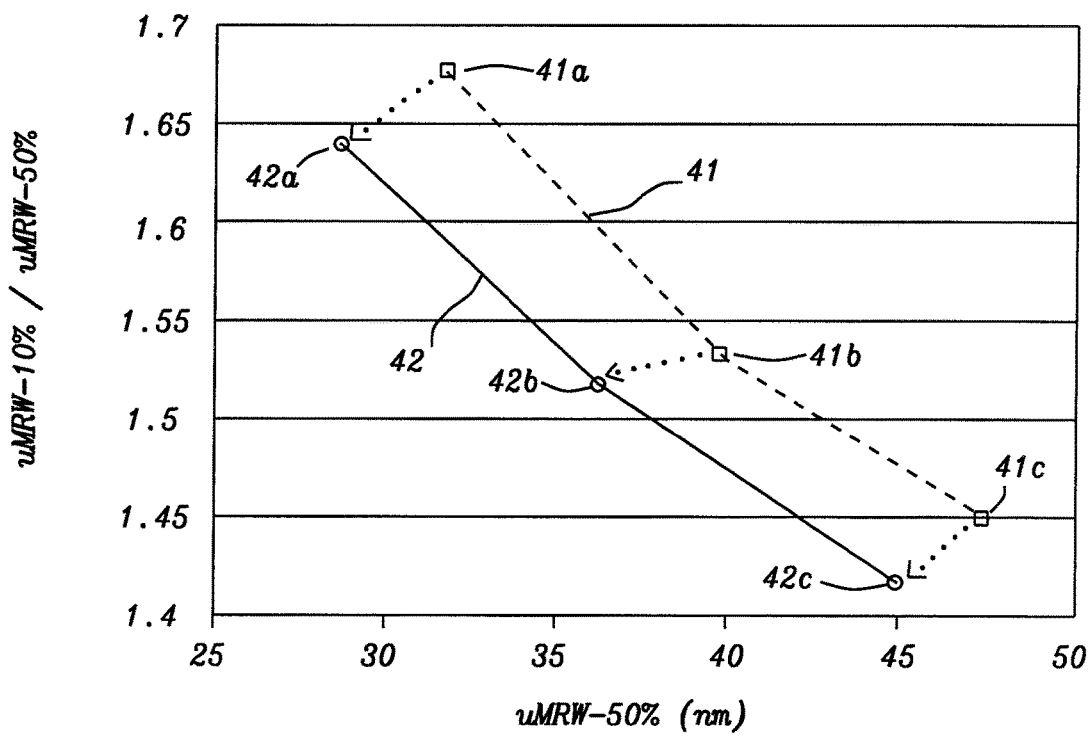
FIG. 3a is a plot of sharpness vs. uMRW-50% for various sensor stack widths and reader shield spacing values.
Figure 3B:
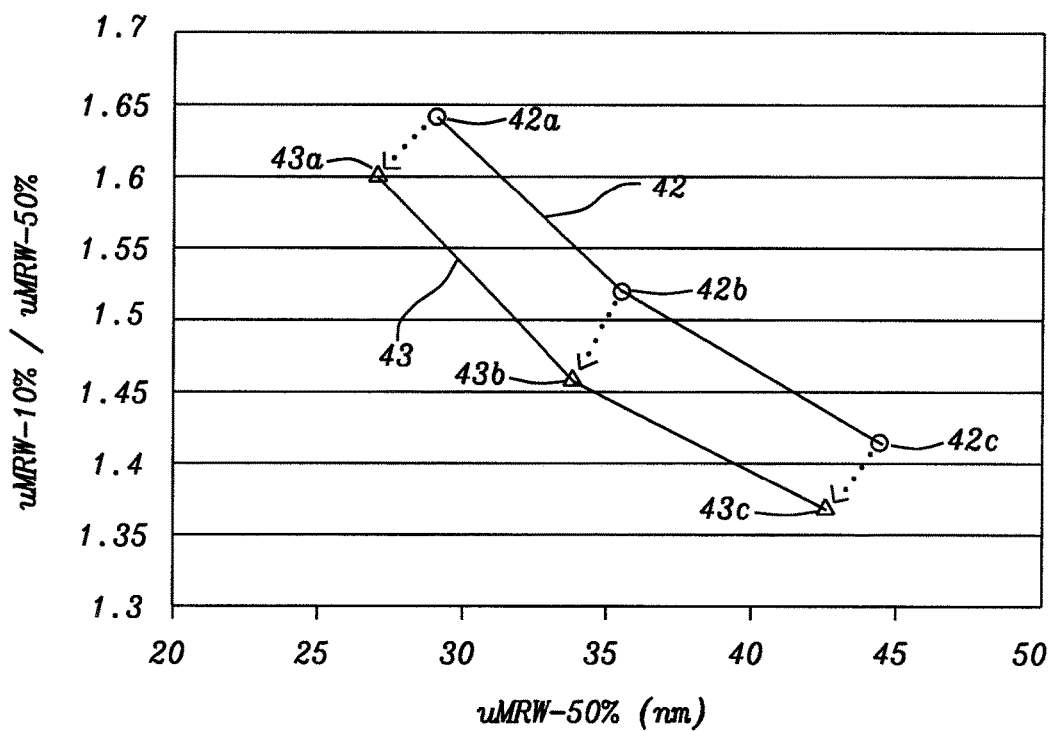
FIG. 3b is similar to FIG. 3a except that the effect of side shields on sensor performance is included.

The present invention is a magnetoresistive (MR) read head in which a sensor stack has a top spin valve configuration and a self-biasing free layer with PMA that can achieve narrow stack width and a narrow read gap without the need for stabilization from a permanent hard bias structure. The sensor stack design is compatible with a variety of surrounding shield structures that include full and extended side shields. Although the preferred embodiments include a TMR sensor configuration, the sensor stack may also have a CPP GMR or CCP-CPP GMR configuration. The present invention also includes a method of forming the MR read heads as described herein.

In related patent application Ser. No. 12/589,614, we disclosed the advantages of Co/Ni multilayer structures and the like having high PMA in CPP-TMR sensors where the magnetic anisotropy of a $(Co/Ni)_x$ laminated structure arises from the spin-orbit interactions of the 3$d$ and 4$s$ electrons of Co and Ni atoms. Such interaction causes the existence of an orbital moment that is anisotropic with respect to the crystal axes, which are in (111) alignment, and also leads to an alignment of the spin moment with the orbital moment. A method of forming $(Co/Ni)_x$ laminates was disclosed that preserves the interfaces between Co and Ni layers thereby establishing high PMA without the need for a thick seed layer. Moreover, PMA is fully established by selecting an appropriate thin seed layer such as Ta/Ti/Cu or other composites having a fcc(111) or hcp(001) lattice structure as described in the aforementioned related patent application.

First, various embodiments of a MR read head structure formed according to the present invention will be described and then a method for fabricating the MR read head will be provided.

Referring to FIG. 5$a$, a cross-sectional view from the ABS of a MR read head 36 having a TMR sensor stack with a top spin valve structure according to a first embodiment of the present invention is depicted. The TMR sensor stack is comprised of a seed layer 24, free layer 25 with PMA, junction layer 26, reference layer 27, and exchange pinning layer 28 formed sequentially on a bottom shield 21. Bottom shield 21 may be made of CoFe or CoFeNi, for example, and serves as a bottom electrode such that a current can be conducted between the bottom shield and top shield 22$t$ in a current perpendicular to plane (CPP) direction through the sensor stack to read the magnetic state of the free layer 25. The top shield structure also includes side shields 22$a$, 22$b$ that adjoin an insulation layer 23 formed along sidewall 33. When no external magnetic field is applied, the free layer has a PMA oriented in a y-axis direction that is perpendicular to the planes of the sensor stack layers. Reference layer 27 has a magnetization aligned into the plane of the paper (z-axis direction). During a read-back operation, electrical current flows between bottom shield 21 and top shield section 22$t$, which serves as a lead for the sensor, stack. When the free layer magnetization changes due to an applied external field, resistance across the sensor stack changes accordingly. Therefore, with a DC current flowing through the sensor stack, voltage across the stack is used as a measure of the resistance change of the sensor, which is a measure of the field that the free layer 25 experiences. At zero field, free layer and reference layer 27 magnetization directions are orthogonal to each other. When an external field is applied in the z-axis direction such as a medium field during a read-back process, free layer magnetization will rotate towards the z-axis direction and forms a parallel magnetization relative to that of the reference layer 27 thereby creating a low resistance state. When the applied field is in the z-axis direction, free layer magnetization then becomes anti-parallel to the reference layer magnetization and forms a high resistance state which is an identical signal generation mechanism as described in prior art references.

In the exemplary embodiment, the sensor stack has a sidewall 33 that is essentially perpendicular to the bottom shield 21. However, the present invention encompasses other embodiments where the sidewall 33 is sloped such that the width m of the top surface 28$s$ is less than the width of the seed layer 24 along the x-axis. From a top-down view (not shown), the MR sensor may have a circular, elliptical, or polygonal shape with a continuous outer boundary (sidewall 33). Preferably, the width m of the sensor stack is less than 100 nm, and more preferably less than 50 nm for high performance applications.

One important feature of the present invention is the seed layer 24/free layer 25 stack that is employed to establish high PMA in the free layer. In one aspect, the seed layer 24 may be comprised of Ta, Ru, Ti, Cu, Ag, Au, NiCr, NiFeCr, CrTi, or combinations of the aforementioned elements and alloys such as Ta/Ti/Cu as disclosed in related U.S. Pat. No. 8,184,411 while the free layer is a $(Co/Ni)_x$ multilayer, $(CoFe/Ni)_x$ multilayer, or the like where x is from 5 to 50. Alternatively, the seed layer 24 may be Ru with an overlying free layer 25 made of $(Co/Pt)_y$, $(Fe/Pt)_y$, $(CoFe/Pt)_y$, or $(Co/Pd)_y$ where y is an integer of sufficient magnitude to establish high PMA. In another aspect, the free layer may be a single layer of FePt, CoPt, or CoCrPt. Optionally, the seed layer selected for a $(Co/Pt)_y$ or $(Co/Pd)_y$ free layer may be Pt, Pd, or other metals or alloys used in the art. As a result, free layer 25 has a magnetization and magnetic anisotropy parallel to the y-axis and perpendicular to the planes of the sensor stack layers. Preferably, free layer anisotropy is greater than the free layer demag field which makes the sensor scalable to smaller widths. In other words, as sensor size is reduced in an x-axis direction, there is less concern about the demag field destabilizing the free layer magnetization than in a conventional sensor structure where free layer magnetization is oriented along the x-axis. Also, with the perpendicular orientation of free layer magnetization, charges on the free layer top and bottom surfaces produce much less field in the side shields to attract edge charges so that free layer to side shield coupling is reduced.

In an alternative embodiment, the free layer may be a composite or so-called hybrid structure having an upper FL1 layer 25$b$ comprised of a soft magnetic material and a lower FL2 stack or layer 25$a$ made of $(Co/Ni)_x$, $(CoFe/Ni)_x$, $(Co/Pt)_y$, $(Fe/Pt)_y$, $(CoFe/Pt)_y$, $(Co/Pd)_y$, FePt, CoPt, or CoCrPt as described previously. The magnetization of the FL1 layer is aligned perpendicular to the plane of the free layer because of exchange coupling with the FL2 layer, which has perpendicular magnetic anisotropy. The FL1 layer may be one or more of Co, Fe, Ni, B, and Ta such as CoFeB, CoFe, or combinations thereof that is inserted between the FL2 layer and junction layer 26 to improve the interface between the free layer and junction layer and thereby increase the MR ratio. In other words, the FL1 layer may be employed to promote uniform junction layer growth for higher spin polarization and a larger (dR/R) ratio where R is the resistance of the spin valve and dR is the change in resistance when a magnetic field is applied. A higher MR ratio means a faster readout of the sensor's magnetic state.

In the exemplary embodiment, the junction layer 26 contacts a top surface of the free layer 25. Preferably, the junction layer 26 is comprised of MgO to yield a TMR configuration with a high MR ratio. However, oxides of Al, Ti, Zn, or of combinations of the aforementioned metals with Mg are also acceptable in a TMR sensor stack of the present invention. As described in U.S. Patent Applications 2007/0111332 and 2007/0148786 to Headway, a MgO layer may be fabricated by depositing a first Mg layer on a reference layer (or free layer), then performing a natural oxidation process, and finally depositing a second Mg layer on the oxidized first Mg layer. During a subsequent annealing process, the junction layer becomes essentially a uniform MgO layer.

The junction layer 26 may have other non-magnetic compositions. For example, in a GMR embodiment, the junction layer may be comprised of a conductive metal such as Cu. Alternatively, in a CCP-CPP design, the junction layer may comprise an insulator layer formed between two Cu layers, for example, in which thin pathways of Cu called nanopillars are formed in the insulator layer such as an oxide of Mg, Zn, Al, or Ti to electrically connect upper and lower Cu layers.

Above the junction layer 26 is a reference layer 27 which may be made of any high moment soft magnetic layer that together with the free layer 25 and junction layer is capable of producing a high MR signal. For example, reference layer 27 may be one or more of Co, Fe, Ni, B, or Ta, or a combination thereof such as CoFe, CoFeB, or a CoFe alloy. Moreover, reference layer 27 may be a composite such as CoFeB/CoFe.

There is an exchange pinning layer 28 contacting the top surface of the reference layer 27 which serves to pin the magnetization of reference layer 27 along a z-axis direction through exchange coupling during a read-back process. The pinning property is established after an anneal process which includes an applied magnetic field. The present invention anticipates that exchange pinning layer 28 may have one of three configurations.

Figure 5A:
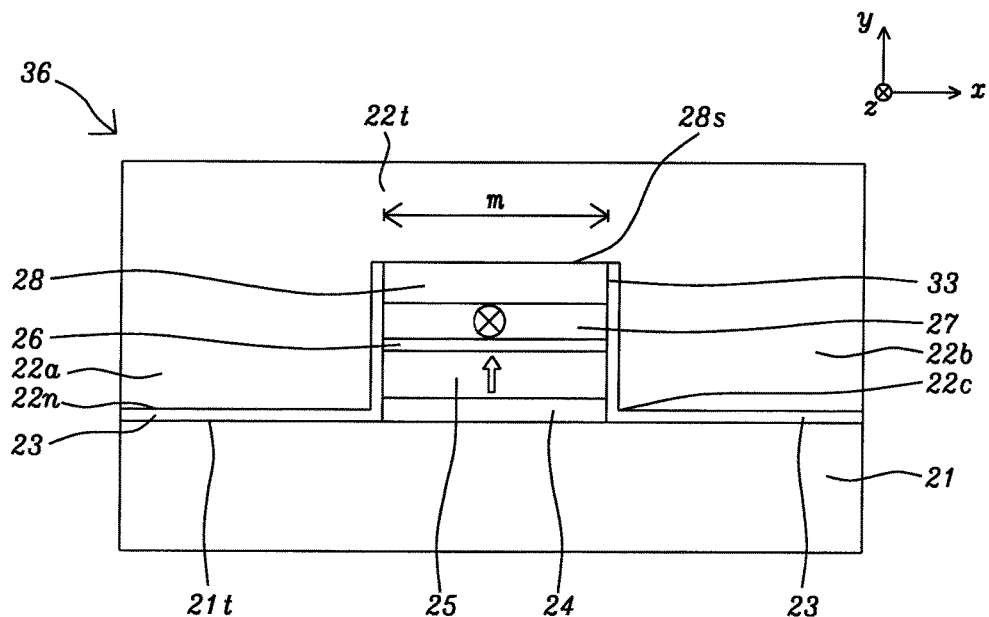
FIG. 5a is a cross-sectional view of a MR sensor stack with a top spin valve configuration and having a self-biasing free layer with PMA, and a surrounding shield structure according to one embodiment of the present invention.
Figure 5B:
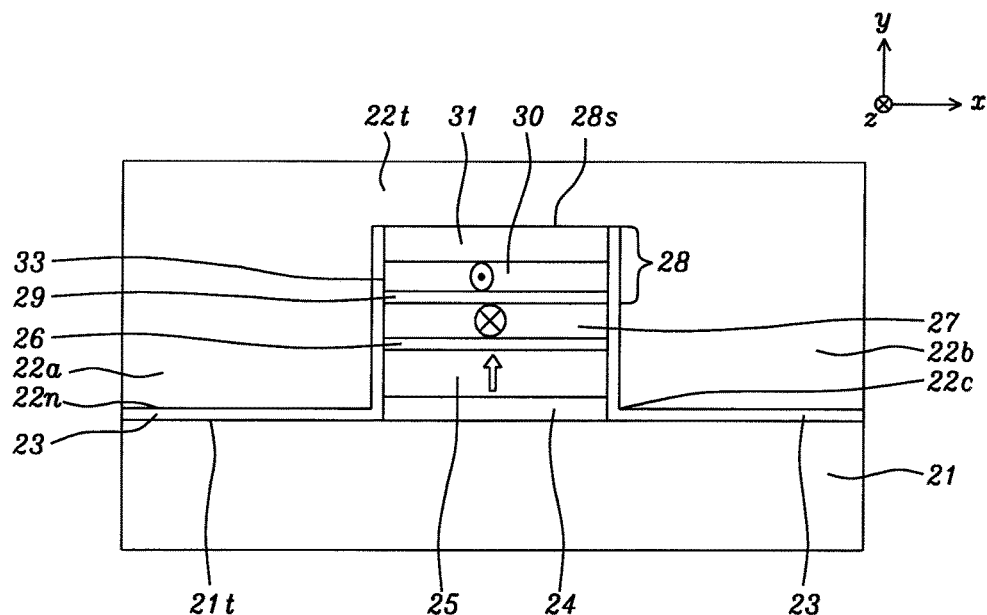
FIG. 5b is a cross-sectional view of a MR sensor stack with a top spin valve configuration and a self-biasing free layer with PMA wherein the exchange pinning layer is a composite according to a second embodiment of the present invention.
Figure 8:
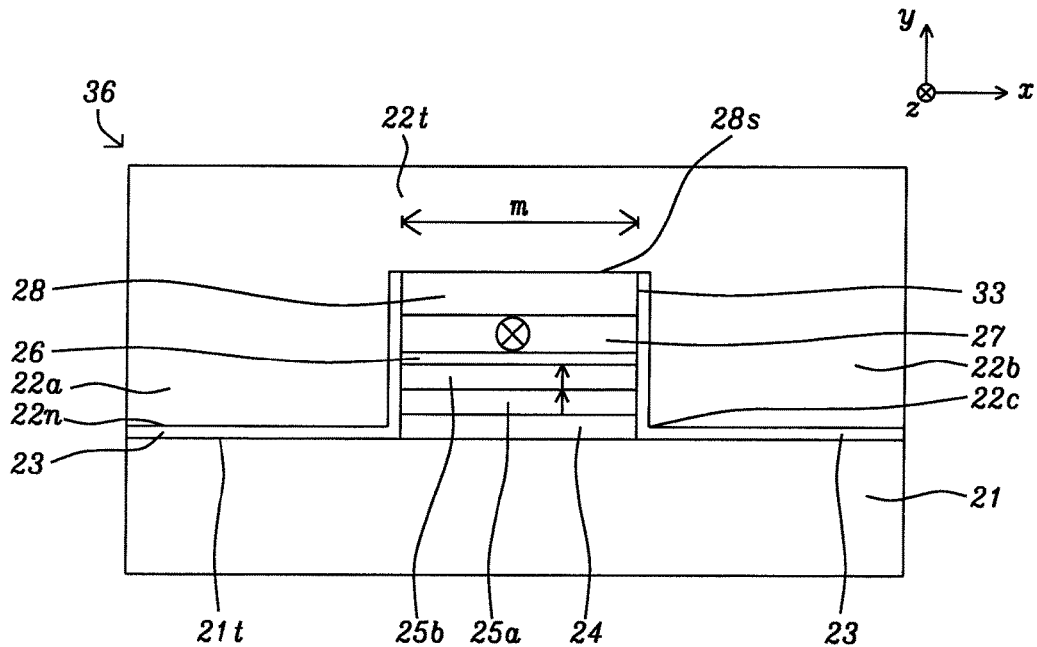
FIG. 8 is a cross-sectional view of a MR sensor stack with a top spin valve configuration and a composite free layer with PMA according to another embodiment of the present invention.

Referring to FIG. 5b, exchange pinning layer 28 may comprise a stack of layers in which a lower coupling layer 29 such as Ru contacts the top surface of reference layer 27, a pinned layer 30 is formed on the coupling layer, and an anti-ferromagnetic (AFM) layer 31 serves as the uppermost layer. Thus, reference layer 27, coupling layer 29, and pinned layer 30 form a well known synthetic anti-ferromagnetic (SAF or SyAF) configuration wherein the AFM layer 31 pins the SyAF configuration by an exchange coupling mechanism. Pinned layer 30 may be comprised of one or more of Co, Fe, Ni, B, or Ta, or combinations thereof such as CoFe or CoFeB and has a magnetization direction anti-parallel to that of the reference layer 27. AFM layer 31 is preferably comprised of MnPt, IrMn, NiMn, OsMn, RuMn, RhMn, PdMn, RuRhMn, or MnPtPd.

Returning to FIG. 5a, the exchange pinning layer 28 may be a single anti-ferromagnetic (AFM) layer that pins the reference layer 27 by exchange coupling and may be comprised of one of the materials previously described with regard to AFM layer 31. In yet another embodiment, exchange pinning layer 28 may be a single layer that is a hard magnetic material having high in-plane anisotropy, which is magnetized into the z-axis direction, by a strong field to obtain its own magnetization and then exchange couples with reference layer 27 to pin the reference layer in the z-axis direction. In other words, the hard magnetic layer has a pre-set magnetization direction. Materials suitable to form a hard magnetic material of this embodiment include CoPt, CoCrPt, FePt, and the like. Note that the embodiment represented by FIG. 5a is preferred over that of FIG. 5b for narrow read gap (RG) applications. The magnetostatic field in the free layer 25 from the uncompensated charges in layers 27, 28 in the preferred embodiment may be offset by the surface coupling, also known as orange peel coupling between free layer 25 and reference layer 27 through junction layer 26 which produces a field in the opposite direction of the magnetostatic field from the layers 27, 28 charges (not shown). In both FIGS. 5a-5b, the lowest surface 22n of the side shields 22a, 22b is above a plane that includes the bottom shield's highest surface 21t.

In another embodiment (not shown), there may be a capping layer formed on exchange coupling layer 28 as the uppermost layer in the sensor stack. The capping layer may have a Ru/Ta/Ru configuration where the upper Ru layer is used to provide oxidation resistance and excellent electrical contact to the top shield. The Ta layer may serve as a hard mask and can be included to offer etch resistance in subsequent processing steps. Alternatively, other capping layer materials used in the art may be selected to serve as a capping layer.

Referring to FIG. 6, a second embodiment of the present invention is shown that represents a modification of the first embodiment. In particular, the sensor stack of layers is the same as in FIG. 5a but the shield structure is extended in the (−) y-axis direction. Insulation layer 23 is comprised of a top section 23c adjoining sidewall 33, a middle section 23b adjoining a pedestal portion 21p of bottom shield 21, and a lower section 23a formed on a top surface 21h of bottom shield 21 that is parallel to the top surface 28s. As explained in a later section, the pedestal portion 21p of bottom shield 21 is formed by an ion milling or etching process. In one aspect, the sides 21s of the pedestal portion 21p may be formed at an angle α greater than 0 degrees with respect to a plane 37-37 that is perpendicular to the bottom shield 21 and overlaps sidewall 33 to avoid a high aspect ratio (and possible structural collapse) where the combined thickness of the sensor stack and pedestal portion 21p is substantially greater than the sensor stack width. However, the present invention also anticipates a configuration wherein sides 21s may be essentially vertical and coplanar with sidewall 33.

An advantage of the second embodiment is that sides 21s extend a distance d of 10 to 50 nm below the bottom surface of seed layer 24 so that a sharp corner 22c is not located proximate to free layer 25. Those skilled in the art recognize that sharp corners in a magnetic shield generate a substantial amount of flux leakage that can have a detrimental affect on magnetic stability in a nearby free layer. By shifting the sharp corner 22c from a location close to free layer (FIGS. 5a, 5b) to a location that is a substantial distance from free layer 25 in FIG. 6, there should be considerably less flux leakage impacting the free layer. Instead, the leakage magnetic flux from corners 22c in FIG. 6 is retained within the side shields 22a, 22b and this condition leads to a MR sensor with higher stability and less noise. As a result, the bottom surface 22n of side shields 22a, 22b is at a level that is preferably below that of the top surface 21t of the bottom shield 21. Furthermore, isolation layer 23 is preferably conformal to sidewall 33, side 21s, and top surface 21h (of etched regions of bottom shield 21). The exchange pinning layer 28 may be an AFM layer or a hard magnetic layer as explained in the first embodiment.

In an alternative embodiment, the sensor stack may be comprised of an exchange pinning layer 28 that is a composite including a lower coupling layer 29 which contacts reference layer 27, a middle pinned layer 30, and an uppermost AFM layer 31 as previously described. Side shields 22a, 22b may be considered extensions of top shield 22t and are extended in the (−) y-axis direction for the purpose of providing effective side shielding for free layer 25. Note that side shields 22a, 22b adjoin all three insulation layer sections 23a, 23b, 23c. Furthermore, the free layer 25 may have a hybrid (FL2/FL1) structure as previously described, and the sensor stack may include a capping layer (not shown) that contacts top surface 28s as described earlier with regard to the first embodiment.

The present invention also encompasses a method of making the read head structures disclosed in the first and second embodiments. It should be understood that with regard to a process of forming the various spin valve structures of the aforementioned embodiments, all of the layers in the CPP sensor stack may be laid down in a sputter deposition system. For instance, the CPP stack of layers may be formed in an Anelva C-7100 thin film sputtering system or the like which typically includes three physical vapor deposition (PVD) chambers each having 5 targets, an oxidation chamber, and a sputter etching chamber. At least one of the PVD chambers is capable of co-sputtering. Typically, the sputter deposition process involves an argon sputter gas with ultra-high vacuum and the targets are made of metal or alloys to be deposited on a substrate. All of the CPP layers may be formed after a single pump down of the sputter system to enhance throughput.

With regard to FIGS. 5a, 5b, bottom shield 21 is deposited on a substrate (not shown) that may be a gap layer made of dielectric material. The sensor stack is formed by sequentially depositing a seed layer 24, free layer 25, junction layer 26, reference layer 27, and exchange coupling layer 28. The oxidation step during formation of a TMR junction layer such as MgO preferably occurs within an oxidation chamber while all other sensor stack layers may be deposited in a sputter deposition (PVD) chamber within a sputter deposition mainframe. Typically, a photoresist layer is coated on exchange pinning layer or on an uppermost capping layer (not shown) and is then patterned by a well known process to form an array of islands which from a top view have a size and shape essentially equivalent to the desired shape and size of the subsequently formed sensor elements. Moreover, a bottom anti-reflective coating (BARC) may be coated on the uppermost layer in the sensor stack prior to forming the photoresist layer in order to improve the process latitude in a subsequent photo patterning process. Those skilled in the art will appreciate that the sensor array typically includes a plurality of sensor elements that will be separated from each other by dicing at a later stage in the read head fabrication process. Once the photoresist layer is patternwise exposed and developed by a conventional process (not shown), the openings in the photoresist layer are transferred through the underlying layers in the sensor stack by one or more etch steps to generate sidewall 33.

Figure 9:
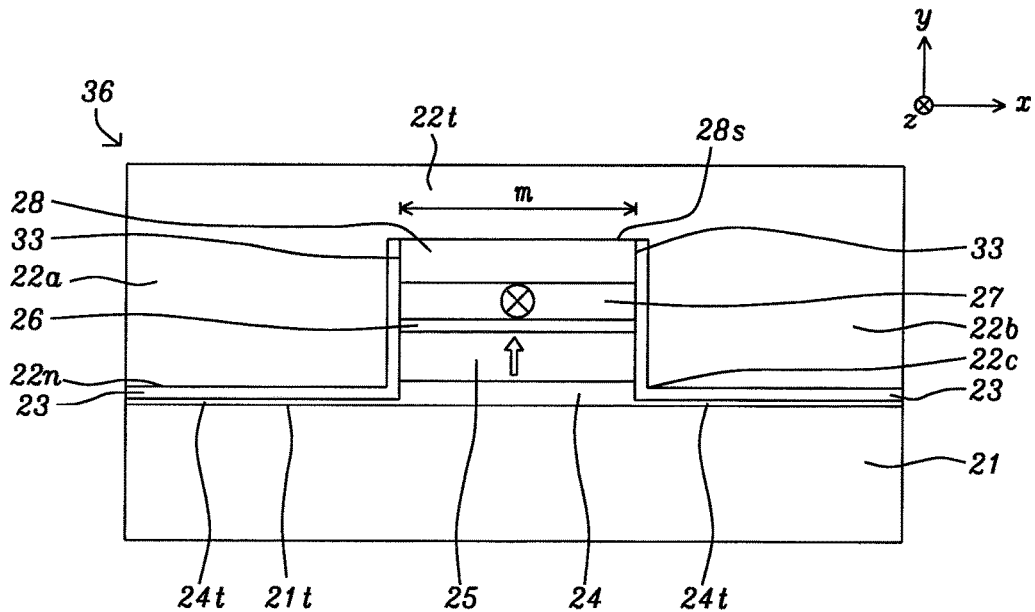
FIG. 9 is a cross-sectional view of another embodiment of the present invention where a MR sensor stack sidewall stops in a seed layer, and does not contact a bottom shield.

According to another embodiment illustrated in FIG. 9, the etch process stops in seed layer 24 such that a thin film 24t of seed layer remains on bottom shield 21. Alternatively, the etch process stops within bottom shield 21 and on a plane that is essentially coplanar with the bottom surface of seed layer 24.

With regard to the second embodiment (FIG. 6), the reactive ion etch (RIE) or ion beam etch (IBE) process that transfers a pattern in a photoresist layer through the sensor stack may be extended to remove a substantial portion of exposed regions of bottom shield 21 such that sidewall 21s extends a distance d of 10 to 50 nm below the bottom surface of seed layer 24. Furthermore, a latter portion of the etch process may be manipulated to form an angle α that is >0 degrees for sides 21s with respect to plane 37-37 as appreciated by those skilled in the art. Thus, the top surface 21t of the pedestal portion 21p of bottom shield 21 may have a smaller width along the x-axis direction than the base 21b of the pedestal portion if angle α is greater than 0 degrees. However, as described previously, side 21s may be coplanar with sidewall 33 when α=0 degrees. Next, a conformal insulation layer 23 is laid down by a sputter deposition process or physical vapor deposition (PVD) method, for example. The photoresist layer is removed by a conventional stripping process to leave an insulation layer having a top section 23c adjoining sidewall 33, a middle section 23b adjoining sides 21s, and a bottom section 23a adjoining top surface 21h. The top shield 22t and adjoining side shields 22a, 22b are deposited by a conventional plating process, for example. A chemical mechanical polish (CMP) process may be employed to yield a planar top surface for top shield 22t.

The present invention also encompasses an annealing step after all layers in the CPP sensor structure have been deposited. An annealing process may be performed to set the magnetization direction of the exchange pinning layer 28 and reference layer 27 by heating the patterned MR sensor to a temperature range of 200° C. to 250° C. while applying a magnetic field along the z-axis direction of preferably >8000 Oe. Note that the applied magnetic field along the z-axis does not affect the PMA of free layer 25.

Returning to FIGS. 5a, 5b, a similar sequence of isolation layer 23 deposition, photoresist layer removal, annealing, plating, and CMP may be followed to form a sidewall 33, side shields 22a, 22b adjoining the sidewall, and a top shield 22t contacting the top surface 28s of the sensor stack after the sensor stack is patterned.

The MR sensors of the present invention as depicted in FIGS. 5a, 5b, 6 are readily manufacturable because all of the steps utilize materials and processes already recognized as being acceptable for high throughput fabrication schemes. The exemplary embodiments relate to top spin valve configurations where a free layer is formed below the junction layer since it is understood that a free layer having high PMA is very difficult to grow on an oxide junction layer 26 as is present in a TMR sensor with a bottom spin valve configuration. However, those skilled in the art will appreciate that the present invention may encompass a bottom spin valve configuration in a GMR or CCP-CPP design where a free layer 25 is formed on a surface of a metallic junction layer 26. For example, a bottom spin valve configuration (not shown) may be represented by a structure wherein a seed layer 24, exchange pinning layer 28, reference layer 27, junction layer 26, and free layer 25 are sequentially formed on a substrate such as a bottom shield 21. Furthermore, there may be a capping layer contacting a top surface of the free layer 25.

A free layer with intrinsic PMA is used as an advantage in all embodiments to eliminate the need for a hard bias structure and greatly minimizes shield-free layer coupling that can reduce sensor stability. Furthermore, the MR sensor structure as defined herein is compatible with narrow read gap designs that are desirable for advanced read head performance. Another advantage is that a free layer with PMA as disclosed in the present invention means that free layer self demag is not a destabilizing factor for small sensor sizes and enables the sensor stacks depicted herein to be scaled to small sensor stack widths while retaining high performance. Another benefit of the sensor stack of the present invention is that the effective bias field on the free layer is minimally affected by sensor aspect ratio thereby making tall stripe and narrow width sensors a viable approach for high RA TMR sensor designs. The minimal trade off between biasing field and free layer sensitivity is extendable to sub-50 nm sensor sizes and even to <30 nm sensor dimensions with optimized processes and materials.

While this invention has been particularly shown and described with reference to, the preferred embodiment thereof, it will be understood by those skilled in the art that various changes in form and details may be made without departing from the spirit and scope of this invention.

We claim:

1. A magneto-resistive (MR) sensor, comprising:
    (a) a bottom shield having a top surface;
    (b) a patterned sensor stack of layers including a seed layer, magnetic free layer, junction layer, magnetic reference layer, and an exchange pinning layer that are sequentially formed on a portion of the bottom shield top surface, the patterned sensor stack has a sidewall that extends into the seed layer but does not contact the bottom shield, and said free layer has a magnetization and magnetic anisotropy formed perpendicular to the top surface of the bottom shield in a zero field environment, and parallel to the bottom shield top surface when a magnetic field is applied in an in-plane direction, the reference layer has a magnetization parallel to the bottom shield top surface wherein the reference layer's magnetization direction is maintained by exchange coupling from the exchange pinning layer, and each of the layers in the sensor stack adjoins an air bearing surface (ABS);
    (c) an insulation layer adjoining the sidewall of the sensor stack layer; and
    (d) the top shield contacting a top surface of the patterned sensor stack such that there is electrical contact between the top and bottom shields, said top shield includes side shield sections formed on and adjoining the insulation layer.

2. The MR sensor of claim 1 wherein the side shields have a bottom surface that is above a plane that includes a top surface of the bottom shield.

3. The MR sensor of claim 1 wherein the seed layer promotes perpendicular magnetic anisotropy in the free layer.

4. The MR sensor of claim 1 wherein the seed layer is selected from one of Ta, Ru, Ti, Cu, Ag, Au, NiCr, NiFeCr, CrTi, or a combination of one or more of the aforementioned elements and alloys including a composite that is Ta/Ti/Cu.

5. The MR sensor of claim 1 wherein the free layer is a $(Co/Ni)_x$ multilayer or a $(CoFe/Ni)_x$ multilayer where x is from about 5 to 50.

6. The MR sensor of claim 1 wherein the free layer is made of $(Co/Pt)_Y$, $(Fe/Pt)_Y$, $(CoFe/Pt)_Y$, or $(Co/Pd)_Y$ where y is an integer, or is a single layer of FePt, CoPt, or CoCrPt.

7. The MR sensor of claim 1 wherein the free layer is a composite with An upper FL1 soft magnetic layer contacting the junction layer, and a lower FL2 layer having perpendicular magnetic anisotropy, said FL1 layer has a magnetization perpendicular to the plane of the free layer because of exchange coupling with the FL2 layer.

8. The MR sensor of claim 7 wherein the FL1 layer is comprised of CoFe, CoFeB, or combinations thereof.

9. The MR sensor of claim 1 wherein the reference layer is a soft magnetic layer made of one or more of Co, Fe, Ni, B, and Ta, or is a composite comprising CoFeB and CoFe.

10. The MR sensor of claim 1 wherein the exchange pinning layer is an anti-ferromagnetic (AFM) layer that pins the reference layer.

* * * * *